United States Patent
Hsu et al.

(10) Patent No.: US 8,614,392 B1
(45) Date of Patent: Dec. 24, 2013

(54) MICRO-COMBUSTION POWER SYSTEM WITH DUAL PATH COUNTER-FLOW SYSTEM

(76) Inventors: Ying Hsu, San Clemente, CA (US); Itzhak Sapir, Irvine, CA (US); Paul Ronney, Monrovia, CA (US); G. Jeffrey Snyder, Alta Dena, CA (US)

( * ) Notice: Subject to any disclaimer, the term of this patent is extended or adjusted under 35 U.S.C. 154(b) by 712 days.

(21) Appl. No.: 12/584,460

(22) Filed: Sep. 4, 2009

Related U.S. Application Data

(60) Provisional application No. 61/191,533, filed on Sep. 9, 2008.

(51) Int. Cl.
*H01L 35/32* (2006.01)

(52) U.S. Cl.
USPC ............ 136/217; 136/230; 123/543; 123/545

(58) Field of Classification Search
CPC ...................................................... H01L 35/32
USPC ............................ 136/217, 230; 123/543, 545
See application file for complete search history.

(56) References Cited

U.S. PATENT DOCUMENTS

| | | | |
|---|---|---|---|
| 3,185,201 A * | 5/1965 | Herbst et al. .................... 122/23 |
| 3,364,014 A * | 1/1968 | Fredrick ....................... 420/579 |
| 3,762,960 A * | 10/1973 | Skrabek et al. ............... 148/538 |
| 4,095,998 A | 6/1978 | Hanson |
| 4,802,929 A | 2/1989 | Schock |
| 6,388,185 B1 | 5/2002 | Fleurial |
| 6,563,039 B2 | 5/2003 | Caillat |
| 6,720,704 B1 | 4/2004 | Tavkhelidze |
| 6,787,691 B2 | 9/2004 | Fleurial |
| 7,273,981 B2 | 9/2007 | Bell |
| 7,400,050 B2 | 7/2008 | Jovanovic |
| 7,435,896 B2 | 10/2008 | Adachi |
| 7,446,256 B2 | 11/2008 | Kanno |

(Continued)

OTHER PUBLICATIONS

MacConnell "Low temperature catalytic heaters: the Cataheat range of flameless combustion systems" Platinum metals rev., 1972, 16, (1), 16-21.*

*Primary Examiner* — Jennifer Michener
*Assistant Examiner* — Magali P Slawski
(74) *Attorney, Agent, or Firm* — W. Eric Boyd, Esq.

(57) ABSTRACT

A micro-combustion power system is disclosed. The invention is comprised of a housing that further comprises two flow path volumes, each having generally opposing flow path directions and each generally having opposing configurations.

Each flow path volume comprises a pre-heating volume having at least one pre-heating heat exchange structure. Each flow path volume further comprises a combustion volume having a combustion means or structure such as a catalytic material disposed therein Further, each flow path volume comprise a post-combustion volume having at least one post-combustion heat exchange structure.

One or more thermoelectric generator means is in thermal communication with at least one of the combustion volumes whereby thermal energy generated by an air/fuel catalytic reaction in the combustion volume is transferred to the thermoelectric generator to convert same to electrical energy for use by an external circuit.

A novel element of the invention relates to the opposing configuration and opposing flow path directions of the respective flow path volumes. The pre-heating heat exchange structure in the first flow path volume and the opposing post-combustion heat exchange structure are comprised of a shared, thermally conductive structure and material. In this embodiment, waste heat from the exhaust gas in the post-combustion chamber is thermally transferred to the opposing pre-heating volume to heat the air/fuel mixture therein to a suitable pre-combustion temperature to take advantage of waste heat while better managing thermal/cooling issues of the device during operation.

8 Claims, 3 Drawing Sheets

(56) References Cited

U.S. PATENT DOCUMENTS

| | | |
|---|---|---|
| 7,449,628 B2 | 11/2008 | Zenitani |
| 7,480,984 B1 | 1/2009 | Sakamoto |
| 7,498,507 B2 | 3/2009 | Weaver, Jr. |
| 2004/0025702 A1* | 2/2004 | Cutter et al. .................. 99/279 |
| 2007/0269758 A1* | 11/2007 | Hofbauer et al. ............. 431/328 |
| 2009/0007953 A1 | 1/2009 | Hsu |

* cited by examiner

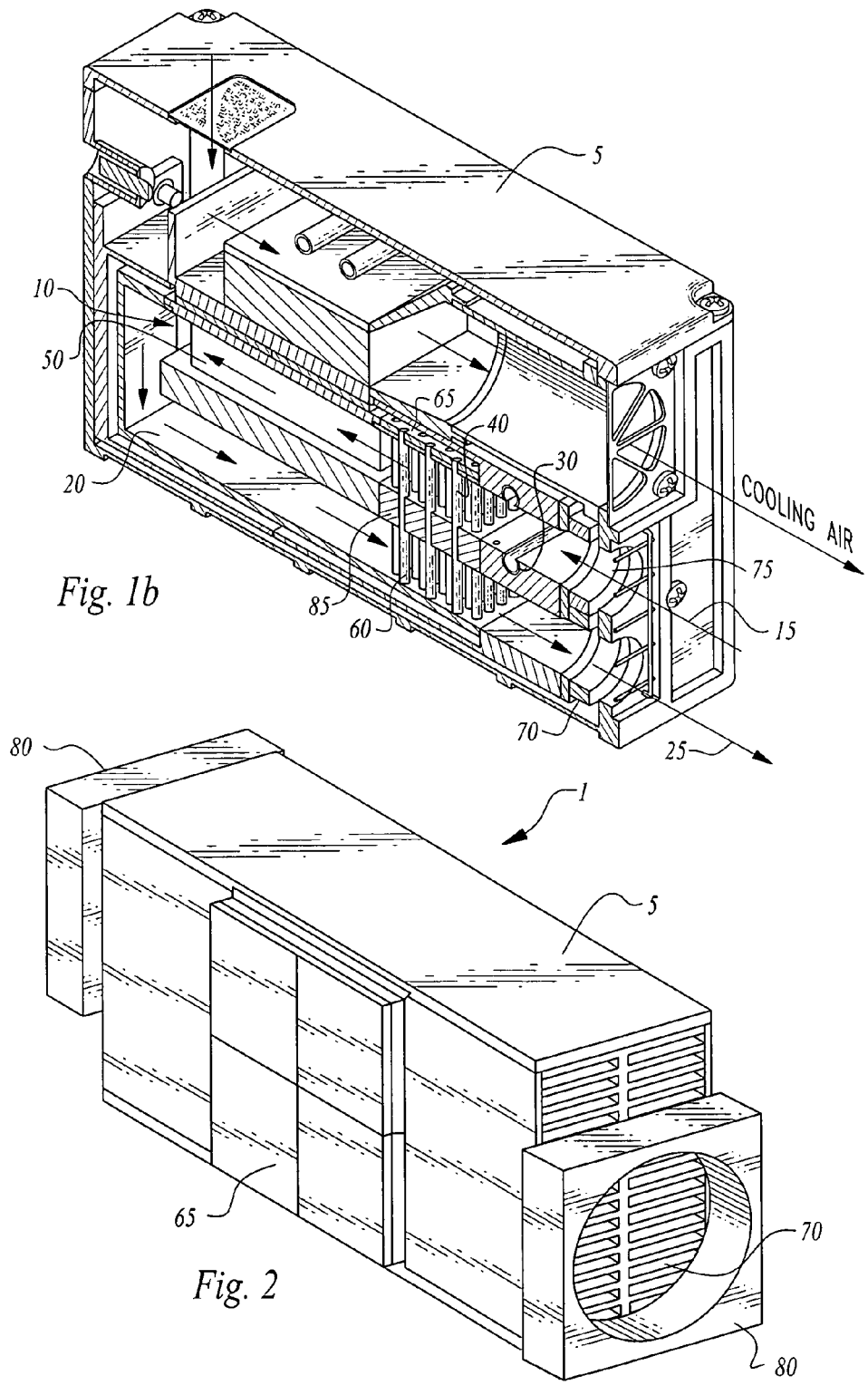

MICRO-COMBUSTION POWER SYSTEM WITH DUAL PATH COUNTER-FLOW SYSTEM

CROSS-REFERENCE TO RELATED APPLICATIONS

This application claims the benefit of U.S. Provisional Patent Application No. 61/191,533, filed on Sep. 9, 2008 entitled "Micro-combustion Power System with Dual Counter Flow System" pursuant to 35 USC 119, which application is incorporated fully herein by reference.

STATEMENT REGARDING FEDERALLY SPONSORED RESEARCH AND DEVELOPMENT

This invention was made with Government support under Contract No. FA-8651-06-M-0180 awarded by the United States Air Force.

The Government has certain rights in the invention.

FIELD OF THE INVENTION

The invention relates generally to the field of micro-combustion electrical power systems. More specifically, the invention relates to MEMS-scale electrical power systems that utilize a combustible fuel to produce electrical power using a thermoelectric generator element.

BACKGROUND OF THE INVENTION

Mobile electronic devices are common in consumer, industrial and military environments. Due to their portable nature, mobile electronic devices typically rely on a portable electrical power source such as a battery.

A new type of portable electrical power source has arisen out of several technological breakthroughs, namely developments in micro-scale combustion (micro-combustion) and high-efficiency thermoelectric materials.

The advent of these two technologies enables electrical power generation using the high energy content of liquid hydrocarbon fuels such as propane, butane, kerosene, JP-8 or gasoline in such small form factors as to be compatible with mobile applications. Liquid hydrocarbon fuel has a very high energy density in the range of 70 to 100 times that of the current lithium-ion based batteries. Given this high energy content, even a modest energy conversion efficiency of 10% results in potentially a ten times improvement in current battery energy density.

What is currently lacking is a mobile electrical power system that combines the above technologies to accomplish miniature power generation with features such as a MEMS-based micro-combustion power system with multiple cells capable of providing sustained power levels of one to 50 watts. This relatively high power is an enabling technology advantageous for use in miniaturized smart munitions or to achieve greater autonomy and improved flight control in military systems.

Further needed is a micro-combustion power system that has a capacity in the range of 10 to 200 watts-hours. In this range, a micro-combustion power system exceeds the performance of electrochemistry batteries or fuel cells with a potential advantage of in the range of eight times higher energy density than lithium-ion.

Thermal and liquid reserve batteries generally separate the electrolyte from active electrodes and maintain the electrolyte in solid state until activation. Micro-combustion power systems have similar design advantages in that the fuel is physically separated from the energy converter chips. Until the fuel is channeled into the microcombustor and activated, no electro-chemical action takes place, thereby enhancing the reliability of the system.

One of the main drawbacks in the prior art is the power consumption in existing micro combustion power supplies relating to the use of air injector fans necessary to flow the fuel and air mixture through the microcombustor system. In practice, this requirement means the pressure drop in the entire flow path within the microcombustion power system must be kept to a minimum, starting from pumping the oxidant (air) into the pre-heating chamber, through the microcombustor combustion volume, the post-combustion volume and finally exhausted through the outlet port. The pressure drop through the heat exchanger components is relatively high because of the long length needed to achieve efficient convective heat transfer to the thermoelectric generator element.

The invention disclosed herein overcomes the above deficiencies in prior art micro-combustion power supply devices by providing is a dual path, counter-flow system. By dividing the microcombustor into two sections, the invention recovers exhaust heat by placing a post-combustion heat exchange structure downstream of each microcombustor to pre-heat the opposing cold air/fuel mixture stream.

The resulting benefit is an air/fuel mixture flow arrangement with two direct opposing flow paths and a minimum pressure drop along each of the paths.

The above invention is desirably implemented as a MEMS-based micro-combustion power system comprising micro-machined silicon structures that are small and lightweight and can be easily packaged to protect the device from harsh operating environments.

SUMMARY OF THE INVENTION

The instant invention takes advantage of MEMS-scale technology and the catalytic combustion reaction arising out of the oxidation of a combustible fuel such as a hydrocarbon interacting with a catalytic material.

In a preferred embodiment, the invention is comprised of a housing that further comprises two flow path volumes, each having generally opposing flow path directions and each generally having opposing configurations.

Each flow path volume comprises a pre-heating volume having at least one pre-heating heat exchange structure. Each flow path volume further comprises a combustion volume having a combustion means or structure such as a catalytic material disposed therein. Further, each flow path volume comprises a post-combustion volume having at least one post-combustion heat exchange structure.

One or more thermoelectric generator means is in thermal communication with at least one of the combustion volumes whereby thermal energy generated by the catalytic reaction in the combustion volume is transferred to the thermoelectric generator to convert same to electrical energy for use by an external circuit.

In operation, a predetermined amount of fuel is combined in an air/fuel mixture and is introduced into each respective pre-heating volume by a fuel valving means and by air pressurization means (such as a fan). The air/fuel mixture is directed from the pre-heating volume into the combustion volume where the oxidation reaction of the air/fuel mixture in the presence of the catalytic material generates thermal energy.

The resultant thermal energy is transferred to the thermo-generator means which converts same into electrical energy.

The heated exhaust gases from the catalytic reaction are then directed further into the respective post-combustion volumes whereby entrained thermal energy in the exhaust gas is absorbed by the post-combustion heat exchange structures disposed therein.

A novel element of the invention relates to the opposing configuration and opposing flow path directions of the respective flow path volumes. In this embodiment, the pre-heating heat exchange structure in the first flow path volume and the opposing post-combustion heat exchange structure are comprised of a shared, thermally conductive structure and material. In this embodiment, waste heat from the exhaust gas in the post-combustion chamber is transferred to the opposing pre-heating volume to heat the air/fuel mixture therein to a suitable pre-combustion temperature to take advantage of waste heat while better managing thermal/cooling issues of the device during operation.

BRIEF DESCRIPTION OF THE DRAWINGS

FIG. 1b illustrates a cross-section of an alternative preferred embodiment of the invention.

FIG. 2 is a perspective view of FIGS. 1 and 1a of the invention.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

Turning now to the figures wherein like numerals define like elements among the several views, FIGS. 1, 1a, 2 and 3 illustrate a preferred embodiment of the dual path counter-flow micro-combustion power system 1 of the invention.

Figure 1:
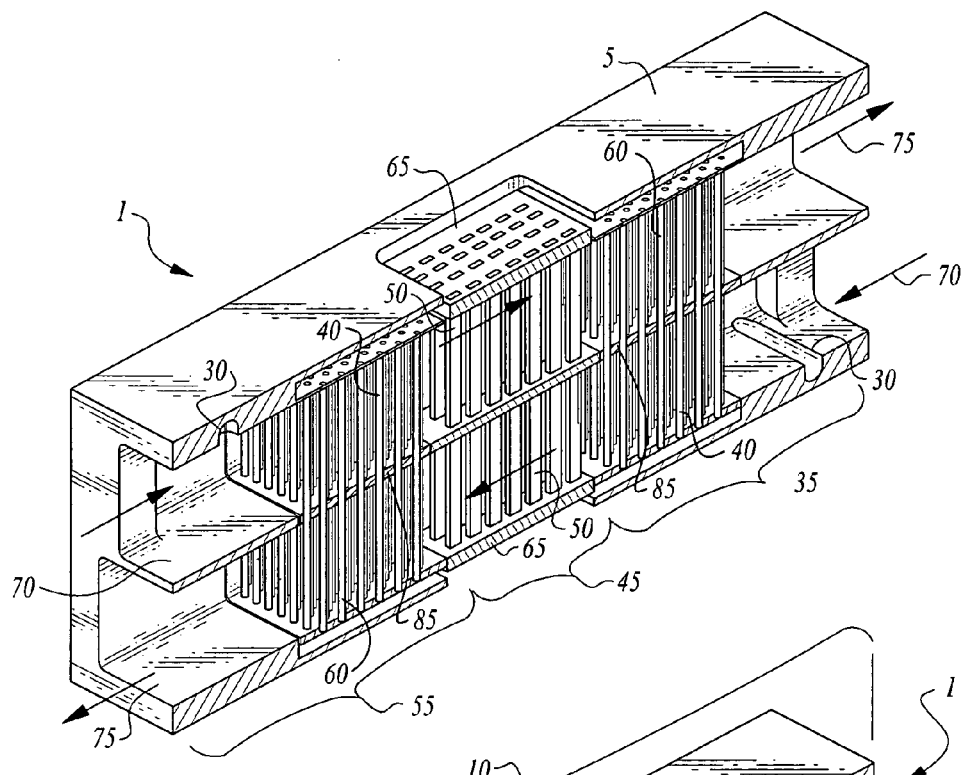
FIGS. 1 and 1a are cross-sectional views of a preferred embodiment of the invention.
Figure 1A:
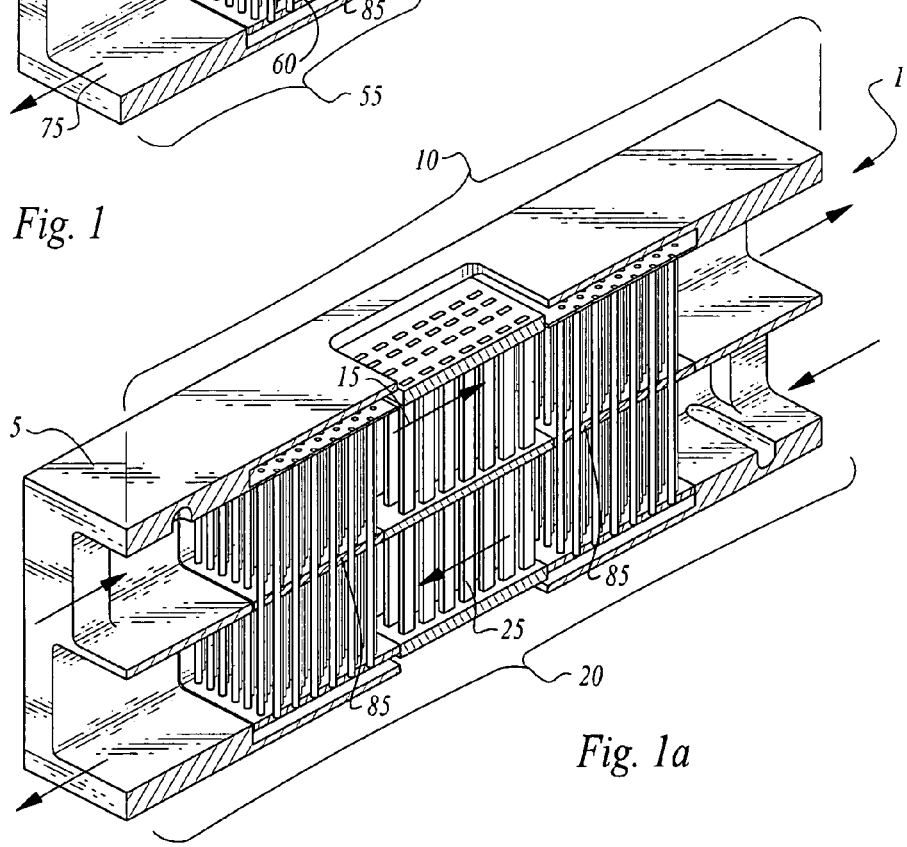

As seen in FIGS. 1 and 1a, micro-combustion power system 1 comprises a housing 5. Housing 5 comprises a first flow path volume 10 having a first flow path direction 15 and a second flow path volume 20 having a second flow path direction 25 opposing said first flow path direction 15.

Each of said flow path volumes comprises fuel valving means 30, a pre-heating volume, 35, a pre-heating heat exchange structure 40, a combustion volume 45, combustion means 50, shown as a finned element herein, a post-combustion volume 55, a post-combustion heat exchange structure 60, at least one thermoelectric generator means 65, an inlet port 70, an outlet port 75, air pressurization means 80 and insulating heat exchange frame means 85.

In a preferred embodiment, micro-combustion power system 1 is fabricated using micro-machined electro-mechanical systems processes (i.e. MEMS) to provide a very small form factor, high electrical power-to-weight power source.

The fuel utilized in the combustion process may be any suitable fuel with sufficient thermal and combustion properties capable of generating sufficient heat to generate electric power from the selected thermoelectric generator means of the device as is further discussed below. Exemplar fuel means may comprise, by way of example and not by limitation, gasoline, propane, hydrogen, kerosene, JP-8, butane or other equivalent fuels or liquid hydrocarbons.

Fuel valving means 30 introduces a predetermined amount of fuel into pre-heating volume 35. Mixing air is also supplied to pre-heating volume 35 through inlet port 70 at a predetermined fuel/air ratio for subsequent combustion. Mixing air may be introduced into pre-heating volume 35 by air pressurization means 80. Air pressurization means 80 may, by way of example, comprise a synthetic MEMS or piezoelectric air jet actuator, fan, compressed air source or equivalent. Suitable control electronics are provided to support the appropriate elements of the invention, i.e., for instance, air pressurization means 80 and fuel valving means 30.

Fuel valving means 30 may be selected by its ability to suitably atomize and/or vaporize the selected fuel. By way of example and not by limitation, fuel valving means 30 may comprise an orifice, port or aperture of a predetermined geometry disposed at an appropriate location with respect to pre-heating volume 35, a micro-scale shutoff valve, a nozzle or micro-nozzle such as are used in inkjet printing, a fuel injector or a capillary force vaporizer as is available from Vapore, Inc.

In a preferred embodiment, fuel is introduced into the microcombustion system using the fuel valving means 30 of each of the first flow path volume 10 and second flow path volume 20. Fuel valving means 30 is disposed proximal the respective inlet port 70 of each flow path volume to provide a predetermined air/fuel mixture ratio. Air pressurization means 80 is utilized to direct the air/fuel mixture toward pre-heating volume 35 and across the surface of the one or more pre-heating heat exchange structures 40. As is discussed further below, a portion of the thermal energy contained within the pre-heating heat exchange structures 40 is transferred into the air/fuel mixture as it passes over the surface thereof.

A combustion volume 45 is provided in fluid communication with pre-heating volume 35 for the receiving of the pre-heated air/fuel mixture. Combustion volume 45 is comprised of combustion means 50 which may, by way of example and not by limitation, comprise a plated-on catalytic material such as platinum, palladium or other equivalent catalytic combustion means.

Combustion means 50 may be plated or disposed on the interior surface of combustion volume 45 or plated or disposed upon a high-surface area structure such as the illustrated finned combustion means element 50 which maximizes the surface area available for a catalytic reaction between the air/fuel mixture and combustion means 50.

Ignition means such as a spark element, micro-flame or equivalent may optionally be provided in or proximal combustion volume 45 to initiate a combustion reaction.

The combustion reaction that occurs within combustion volume 45 between the air/fuel mixture and combustion means 50 generates thermal energy and heated exhaust gas as a byproduct.

As seen in the figures, combustion means 50 is in thermal communication with at least one thermoelectric generating element 65.

Thermal energy from the earlier referenced combustion reaction is passed through by air pressurization means 80 to the warm side of thermoelectric generating means 65 that is proximal and in thermal communication with at least a portion of combustion volume 45.

Preferred embodiments of thermoelectric generator means 65 include bismuth telluride and lead telluride, thin film such as super lattice or quantum well devices or nano-composite structures or any equivalent thermoelectric generator devices capable of generating electrical power using thermal energy as an input.

Because lead telluride and bismuth telluride have significantly different thermoelectric performance characteristics across the expected operating temperature range of the invention, a two-stage design using both materials can be used to improve device efficiency and to reduce maximum operating temperature.

FIGS. 1 and 1a reflect a preferred embodiment of combustion means 50 showing a finned element that has its channeled surface area plated with a catalytic material to define combustion means 50. A finned combustion means element 50 is desirably disposed within the interior of combustion volume 45 to generate a combustion reaction. The channel surfaces of finned combustion means element 50 are, for instance, coated with a suitable catalyst, typically platinum or palladium such as is available from Catacel Corp. (Garrettsville, Ohio).

Substrate materials for finned combustion means element may comprise, for instance, silicon, ceramic or stainless steel.

Figure 3:
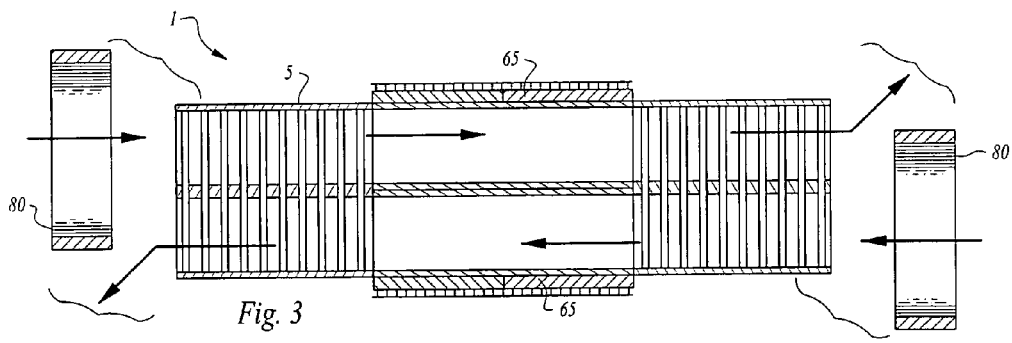
FIG. 3 is a cross-section showing another view of the invention.

As further seen in FIGS. 1, 1a, and 3, heated exhaust gases from the combustion reaction in the combustion volume 45 are transferred into post-combustion volume 55. Post-combustion volume 55 comprises post-combustion heat exchange structure 60 for the absorbing and transfer of thermal energy entrained in the heated exhaust gas. In this manner, thermal energy entrained within the exhaust gases from combustion is transferred, in part, to post-combustion heat exchange structure 60 which is disposed within or proximal post-combustion volume 55.

As noted above, a novel feature of the invention relates to the opposing configuration and opposing flow path directions of the respective flow path volumes. In this embodiment, pre-heating heat exchange structure 40 in first flow path volume 10 and the complementary post-combustion heat exchange structure 60 disposed in post combustion volume 55 are comprised of a shared, thermally conductive structure and material, for instance a copper material (e.g., copper pins) or other suitable equivalent thermal structure.

Each of the respective heat exchange structures is preferably disposed in a highly thermally insulative frame means 85. Insulative frame means 85 is preferably comprised of a material that permits thermal energy transfer vertically along and through the heat exchange structures (i.e. heat pipes) while limiting heat transfer in other directions between the respective pre-heating and post-combustion volumes and limiting heat transfer along the flow path volumes themselves.

Insulative frame means 85 is desirably fabricated from a thermally insulative material such as Vespel SP1 as is available from DuPont E. I. De Nemours & Co.

In this manner, the heat exchange structures provide a well-defined and uniform thermal path through and into the pre-heating and post combustion volumes while insulative frame means 85 minimizes flow path stream heat conduction along the interior walls of the flow path volumes. This in turn, beneficially minimizes the temperature difference across the heat exchange structures for higher system efficiency.

The same shared configuration is seen in FIGS. 1, 1a and 1b where the pre-heating heat exchange structure 40 disposed within second flow path volume 20 is a commonly shared, thermally conductive material and element as the post-combustion heat exchange structures 60 disposed within first flow path volume 15.

In other words, each of the respective pre-combustion heat exchange structures and post combustion heat exchange structures in the adjacent first and second flow paths function as heat pipes for the transfer of post-combustion thermal energy into the adjacent pre-heating volumes. In this embodiment, waste heat from the exhaust gas in the post-combustion chamber is thermally transferred to the opposing pre-heating volume to heat the air/fuel mixture therein to a suitable pre-combustion temperature to take advantage of waste heat while better managing thermal/cooling issues of the device during operation.

The exhaust gases in post-combustion volume 55 pass through outlet port 75 to an external location.

An alternative preferred embodiment of the invention is shown in FIG. 1b. In this embodiment, the flow path volumes 10 and 20 and flow path direction 15 and 25 are in fluid communication with each other (i.e. the flow path volumes share a common volume within the housing 5) and whereby the respective flow path directions are opposing by means of an approximate 180 degree redirection of the flow within the housing 5.

As is readily seen, this embodiment takes advantage of the shared pre-heating heat exchange structure 40 with post-combustion heat exchange structure 60 for the transfer of waste heat from the heated exhaust gas into the pre-combustion volume 45 for the preheating of the air/fuel mixture as it passes through same.

The invention preferably uses simple liquid hydrocarbon fuels that are widely available, that can be easily stored and are in gaseous form at normal operating temperature range. Examples of these fuel types include butane and propane which are used in consumer products such as cigarette lighters and portable cooking stoves.

For military applications however, one of the most commonly used fuels is jet fuel such as JP-8. The makeup of JP-8 is essentially kerosene mixed with other hydrocarbons and additives that allow the fuel to combust over a wide range of temperatures and conditions necessary for military aircraft.

For the invention to efficiently operate using JP-8, the selected fuel valving means 30 should be able to handle the fuel in liquid form at ambient conditions. To combust properly, the liquid JP-8 fuel must first be atomized into droplets, vaporized, and mixed with the oxidant (air). Injecting JP-8 through a micro-nozzle (similar to ink jet technology) to generate small droplets is one preferred embodiment of the invention.

Generation of fuel vapor for combustion using a thermally-driven injector (capillary force vaporizer or CFV injector) may be also accomplished by use of a combination of capillary and vaporization forces. This approach simplifies the operation and manufacture of the invention.

Figure 4:
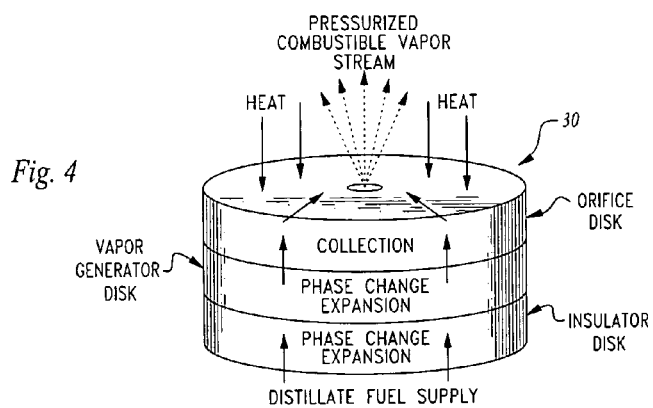
FIG. 4 illustrates a capillary force injector used in a preferred embodiment of the invention.

FIG. 4 illustrates the operating mechanism and general theory of operation of a CFV injector that, in a preferred embodiment, comprises fuel valving means 30. Using the CFV injector embodiment provides a number of benefits. For example, the CFV injector uses heat as the driver to produce pressurized fuel vapor. The invention can desirably use excess exhaust heat as an energy source for the injector. The CFV injector is also capable of working with complex fuels such as JP-8 and is readily available.

Prior art devices have an undesirable attribute in that the air/fuel flow pressure drop through the heat exchanger components is relatively high due to the long flow path length necessary to achieve efficient convective heat transfer. A beneficial result of the shared heat exchange structure elements of the instant invention is enhanced thermal management of the device and a significant reduction in the flow path length of the system.

The disclosed invention overcomes the above deficiencies in prior art micro-combustion power supply devices by providing is a dual path, counter-flow system. By dividing the microcombustor device into two or more sections, the invention is able to recover and recycle exhaust heat by disposing the post-combustion heat exchange structure downstream of each combustion volume to pre-heat the incoming cold air/fuel mixture stream. The resultant benefit is an air/fuel mixture flow arrangement with two direct and opposing flow paths and minimum pressure drop along each of the paths.

It is expressly noted that a plurality of the above micro-combustion power systems can be configured in series or parallel to provide greater voltage, current or power output than an individual micro-combustion cell provides.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. The claims are thus to be understood to include what is specifically illustrated and described above, what is conceptually equivalent, what can be obviously substituted and also what essentially incorporates the essential idea of the invention.

We claim:

1. A combustion power system device comprising:
   a housing comprising a first flow path volume and a second flow path volume wherein each of said flow path volumes comprises, (a) a pre-heating volume comprising a pre-heating heat exchange structure, (b) a combustion volume comprising combustion means comprising a finned element plated with a catalytic material, (c) a post-combustion heat exchange volume comprising a post-combustion heat exchange structure, wherein the post-combustion heat exchange structure and the pre-heating heat exchange structure are comprised of at least one shared thermally conductive elongate structure having a portion thereof disposed in the first flow path volume and a portion thereof disposed in the second flow path volume that is configured to transfer post-combustion thermal energy from one of the post-combustion heat exchange structures to one of the pre-heating heat exchange volumes, (d) at least one thermoelectric generator means and,
   air pressurization means configured to direct an air/fuel mixture through the first flow path volume in a first direction and to direct an air/fuel mixture through the second flow path volume in a second direction opposing the first direction.

2. The device of claim 1 wherein said air/fuel mixture comprises a liquid hydrocarbon.

3. The device of claim 1 wherein said air/fuel mixture comprises a fuel selected from the group consisting of JP-8, gasoline, kerosene, butane, hydrogen and propane.

4. The device of claim 1 further comprised of a capillary force vaporizer.

5. The device of claim 1 wherein said combustion means is comprised of a platinum material.

6. The device of claim 1 wherein said thermoelectric generating means is comprised of a lead telluride material.

7. The device of claim 1 wherein said thermoelectric generating means is comprised of a bismuth telluride material.

8. The device of claim 1 wherein said thermoelectric generating means is comprised of a lead telluride material and a bismuth telluride material.

* * * * *